United States Patent
Koo et al.

(10) Patent No.: US 8,053,851 B2
(45) Date of Patent: Nov. 8, 2011

(54) SPIN TRANSISTOR USING EPITAXIAL FERROMAGNET-SEMICONDUCTOR JUNCTION

(75) Inventors: Hyun Cheol Koo, Seoul (KR); Suk Hee Han, Seoul (KR); Joon Yeon Chang, Seoul (KR); Hyung Jun Kim, Seoul (KR); Kyung Ho Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 345 days.

(21) Appl. No.: 12/233,488

(22) Filed: Sep. 18, 2008

(65) Prior Publication Data

US 2009/0152606 A1   Jun. 18, 2009

(30) Foreign Application Priority Data

Dec. 13, 2007  (KR) .................. 10-2007-0129952

(51) Int. Cl.
*H01L 29/82* (2006.01)
*H01L 21/00* (2006.01)

(52) U.S. Cl. .............. 257/421; 257/E29.167; 438/3; 977/933

(58) Field of Classification Search .......... 257/295, 257/414–428, E29.164; 438/3
See application file for complete search history.

(56) References Cited

U.S. PATENT DOCUMENTS 5,654,566 A * 8/1997 Johnson ............... 257/295
6,069,820 A * 5/2000 Inomata et al. ........ 365/171
7,608,901 B2 * 10/2009 Koo et al. .............. 257/421

OTHER PUBLICATIONS

Datta, Electronic analog of the electro-optic modulator, Appl. Phys. Lett. 56 (7), Feb. 12, 1990, p. 665, 1990 American Institute of Physics.

* cited by examiner

*Primary Examiner* — Matthew W Such
*Assistant Examiner* — Monica D Harrison
(74) *Attorney, Agent, or Firm* — Bradley Arent Boult Cummings LLP

(57) ABSTRACT

A spin transistor conducive to the miniaturization and large scale integration of devices, because a magnetization direction of a source and a drain is determined by a direction of the epitaxial growth of a ferromagnet. The spin transistor includes a semiconductor substrate having a channel layer formed thereinside; ferromagnetic source and drain epitaxially grown on the semiconductor substrate and magnetized in a longitudinal direction of the channel layer due to magnetocrystalline anisotropy—the source and drain being disposed spaced apart from each other in a channel direction and magnetized in the same direction—; and a gate disposed between the source and the drain to be insulated with the semiconductor substrate and formed on the semiconductor substrate to control the spin of electrons that are passed through the channel layer.

13 Claims, 9 Drawing Sheets

SPIN TRANSISTOR USING EPITAXIAL FERROMAGNET-SEMICONDUCTOR JUNCTION

CROSS-REFERENCE TO RELATED APPLICATIONS

This application claims the priority of Korean Patent Application No. 2007-129952 filed on Dec. 13, 2007, in the Korean Intellectual Property Office, the disclosure of which is incorporated herein by reference.

BACKGROUND OF THE INVENTION

1. Field of the Invention

The present invention relates to a spin transistor, and more particularly, to a spin transistor that is conducive to the miniaturization and large scale integration of devices, because a magnetization direction of a source and a drain is determined by a direction of the epitaxial growth of a ferromagnet.

2. Description of the Related Art

Most integrated circuit technologies include devices manufactured utilizing metal oxide semiconductor field effect transistor (MOSFET) technology. In addition, memory devices such as a dynamic random access memory (DRAM), or flash memory, application-specific integrated circuits (ASIC) microprocessors, and logic circuits also operate based on an on/off operation of MOSFET.

In MOSFET, it is difficult to reduce the power consumption and area of the electronic device, and there is a physical limit on the gate oxide film. Among next-generation devices developed to solve the above-mentioned problems, there are devices to control the precession of electron spin using a voltage. Among these devices, a spin transistor includes a source, a drain, and a channel connecting the source and the drain. Here, the spin transistor is turned on/off under the control of the electron spin direction, and there have been attempts to use the spin transistor in switching devices, logic circuits, etc. The conventional semiconductor-based FET devices control the charge in the semiconductor using an electric field, but the spin transistor may control the charge and spin at the same time.

It was known that the previously proposed Datta-Das spin transistor (Applied physics letter, vol 56, 665, 1990) and its similar spin transistor disclosed in U.S. Pat. No. 5,654,566 entitled "Magnetic spin injected field effect transistor and method of operation" are required for injecting spin from a ferromagnet (a source) into a semiconductor, or from a semiconductor into a ferromagnet (a drain). Since ferromagnets (a source and a drain) determining a direction of electron spin in this spin injection are magnetized in a channel direction by using shape anisotropy, the ferromagnetic source and drain have a shape that is extended in a channel direction, and therefore the size (or, length) of the device is enlarged in the channel direction. Implementation of this earlier spin transistor in a large scale device has been difficult, and this spin transistor has problems (for example, low spin injection efficiency) caused by the heterogeneity in the interface of the semiconductor (a substrate) and the ferromagnets (a source and a drain).

SUMMARY OF THE INVENTION

The present invention is designed to solve the problems of the prior art, and therefore it is an object of the present invention to provide a spin transistor that is conducive to miniaturization and large scale integration and has low interface heterogeneity between a semiconductor substrate and ferromagnetic source and drain.

Also, it is another object of the present invention to provide a method for manufacturing a spin transistor that is conducive to the miniaturization and large scale integration and has low interface heterogeneity between a semiconductor substrate and ferromagnetic source and drain.

According to an aspect of the present invention, there is provided a spin transistor including a semiconductor substrate having a channel layer formed therein; ferromagnetic source and drain epitaxially grown on the semiconductor substrate and magnetized in a longitudinal direction of the channel layer due to the magnetocrystalline anisotropy—the source and drain being disposed spaced apart from each other in a channel direction and magnetized in the same direction to each other—; and a gate disposed between the source and the drain to be insulated with the semiconductor substrate and formed on the semiconductor substrate to control the spin of electrons passing through the channel layer.

The spin-polarized electron is injected into the channel layer from the source, passed through the channel layer, and then injected into the drain. Since spin-orbit coupling induced magnetic field is formed according to the voltage of the gate when the electron is passed through the channel layer, the spin of the electron makes the precession on a plane that is vertical to the induced magnetic field.

According to one exemplary embodiment of the present invention, the source and drain may have an easy magnetization axis parallel to a longitudinal direction of the channel layer due to the magnetocrystalline anisotropy. For example, an upper portion of the semiconductor substrate may be formed of GaAs, the source and drain may be formed of hexagonal close packed cobalt (hcp-Co), and a c axis of the hcp-Co may be directed toward a [1 1 0] direction of the GaAs.

According to one exemplary embodiment of the present invention, a crystal orientation alignment layer adjusting the crystal orientation of the source and drain to allow the easy magnetization axis of the source and drain to be directed toward the longitudinal direction of the channel layer may be disposed between the ferromagnetic source and drain and the semiconductor substrate. For example, an upper portion of the semiconductor substrate may be formed of GaAs, the source and drain may be formed of hcp-Co, and a crystal orientation alignment layer made of chromium (Cr) may be disposed between the source and drain and the GaAs.

According to one exemplary embodiment of the present invention, the channel layer may be a two-dimensional electron-gas layer and have a quantum well structure. The two-dimensional electron-gas layer may be formed of a material selected from the group consisting of GaAs, InAs, InGaAs, InSb and combinations thereof.

In this case, the semiconductor substrate may include a lower cladding layer and an upper cladding layer sandwiching the channel layer having the two-dimensional electron gas structure. Here, the lower cladding layer may include a first lower cladding layer and a second lower cladding layer formed under the first lower cladding layer, the second lower cladding layer having a higher band gap than the first lower cladding layer. The upper cladding layer may include a first upper cladding layer and a second upper cladding layer formed on the first upper cladding layer, the second upper cladding layer having a higher band gap than the first upper cladding layer. According to another exemplary embodiment of the present invention, a portion of the semiconductor substrate spanning from a contact surface of the source and drain to the channel layer may be composed of n-doped multiple layers. The n-doped multiple layers may have a doping density that decreases from top to bottom, and the lowest layer of the n-doped multiple layers may be used as the channel layer. In this case, the uppermost layer of the n-doped multiple layers may form a schottky barrier with the source and drain. For example, the n-doped multiple layers may include first to third n-AlGaAs layers sequentially stacked from the bottom, wherein the first n-AlGaAs layer has a lower doping density than the second n-AlGaAs layer and the second n-AlGaAs layer has a lower doping density than the third n-AlGaAs layer.

The semiconductor substrate may have a ridge structure in which both side portions of the semiconductor substrate are removed along a longitudinal direction of the channel layer. The width of channels may be defined by the ridge structure. In this case, an insulating material for planarization may be formed in both sides of the ridge structure.

According to another aspect of the present invention, there is provided a method for manufacturing a spin transistor, the method including: providing a semiconductor substrate having a channel layer formed therein; epitaxially growing a ferromagnetic layer on the semiconductor substrate; defining a longitudinal direction and width of the channel layer by patterning the ferromagnetic layer and the semiconductor substrate; defining a source and a drain by patterning the ferromagnetic layer, the source and the drain being disposed spaced apart from each other along the longitudinal direction of the channel layer; and forming a gate insulator and a gate on the resulting product, the gate insulator and the gate being disposed between the source and the drain, wherein, in the step of epitaxially growing a ferromagnetic layer, the ferromagnetic layer is grown in the form of crystal so that the ferromagnetic layer is magnetized in a longitudinal direction of the channel layer due to magnetocrystalline anisotropy.

According to one exemplary embodiment of the present invention, the step of epitaxially growing a ferromagnetic layer may be performed through the molecular beam epitaxy (MBE) growth.

According to one exemplary embodiment of the present invention, in the step of epitaxially growing a ferromagnetic layer, the ferromagnetic layer may be grown so that the easy magnetization axis of the ferromagnetic layer can be disposed parallel to the longitudinal direction of the channel layer due to the magnetocrystalline anisotropy. For example, an upper portion of the semiconductor substrate may be formed of GaAs, and the step of epitaxially growing a ferromagnetic layer may include: epitaxially growing an hcp-Co layer so that c axis of the hcp-Co is directed toward a [1 1 0] direction of the GaAs.

The method according to the present invention may further include: forming a crystal orientation alignment layer on the semiconductor substrate, between the step of providing a semiconductor substrate and the step of epitaxially growing a ferromagnetic layer, the crystal orientation alignment layer serving to allow the easy magnetization axis of the ferromagnetic layer to be directed toward the longitudinal direction of the channel layer. For example, an upper portion of the semiconductor substrate may be formed of GaAs, a Cr film may be formed as the crystal orientation alignment layer on the GaAs semiconductor, and hcp-Co may be formed as the ferromagnetic layer.

BRIEF DESCRIPTION OF THE DRAWINGS

The above and other aspects, features and other advantages of the present invention will be more clearly understood from the following detailed description taken in conjunction with the accompanying drawings, in which:

FIG. 8 is a plane view illustrating patterns of an hcp-Co ferromagnet used in the spin transistor according to one exemplary embodiment of the present invention. In this case.

DETAILED DESCRIPTION OF THE PREFERRED EMBODIMENT

Exemplary embodiments of the present invention will now be described in detail with reference to the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 1:
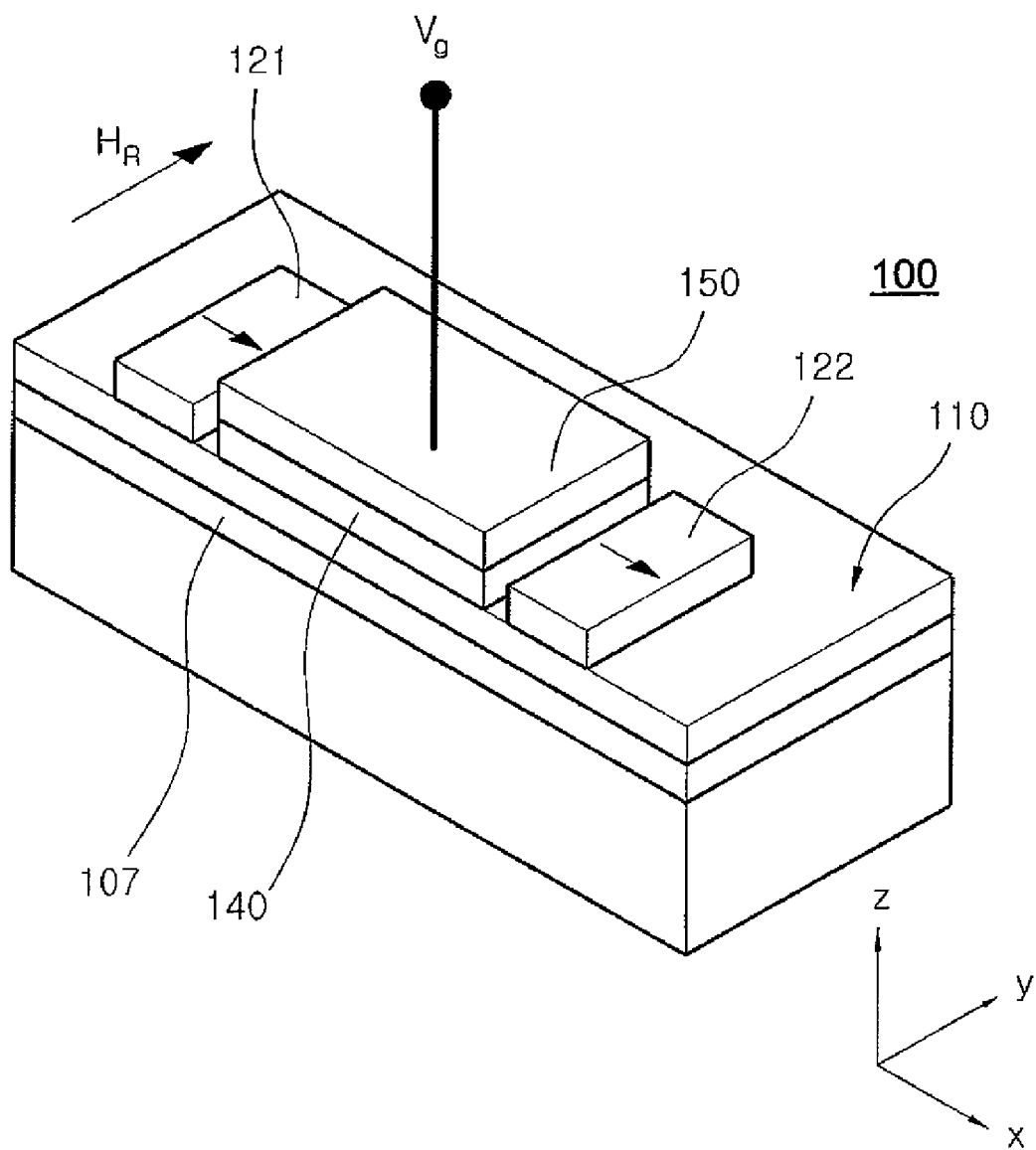
FIG. 1 is a perspective view illustrating a spin transistor according to one exemplary embodiment of the present invention.

FIG. 1 is a perspective view illustrating a spin transistor according to one exemplary embodiment of the present invention. Referring to FIG. 1, the spin transistor 100 includes a semiconductor substrate 110 including a channel layer 107; and ferromagnetic source 121 and drain 122 disposed on the semiconductor substrate 110 to be spaced apart from each other. A gate 150 is formed between the source 121 and the drain 122 and disposed on the semiconductor substrate 110. The gate 150 is insulated from the semiconductor substrate 110 by means of a gate insulator 140 such as $SiO_2$.

As described later, the source 121 and the drain 122 are magnetized in the same direction, and particularly magnetized in a longitudinal direction, for example a channel direction (x direction), of the channel layer. The magnetocrystalline anisotropy of the ferromagnet is used to realize the magnetization direction of the source 121 and the drain 122. In particular, a ferromagnet that is epitaxially grown on the semiconductor substrate 110 is used to magnetize the source 121 and the drain 122 in a certain crystal orientation.

More particularly, for the source and drain 121 and 122 epitaxially grown on the semiconductor substrate 110, a direction of crystal growth in the source and drain 121 and 122 is determined so that the easy magnetization axis can be parallel to the channel direction (x direction) due to the presence of the magnetocrystalline anisotropy. Since the magnetization direction is determined by the crystal orientation of the epitaxially grown ferromagnets, the ferromagnetic source and drain 121 and 122 have a magnetization direction that is directly determined by the crystal growth, unlike the conventional spin transistor (for example, a spin transistor proposed by Datta and Das) using the shape anisotropy.

Therefore, the spin transistor 100 does not need to use the shape anisotropy, and may significantly reduce the lengths of the source and drain 121 and 122. As a result, the miniaturization of spin transistor devices and the large scale integration of electronic devices with spin transistors may be easily achieved. In addition, a distance between the centers of the source and the drain is shortened due to the use of the shortened source and drain 121 and 122, which leads to the improved efficiency of the transistors.

For example, when an upper portion of the semiconductor substrate 110 that is in contact with the ferromagnets (a source and a drain) is formed of GaAs, a channel direction is generally determined to be in a [1 1 0] direction on the basis of GaAs crystal. In this case, the ferromagnets, such as hexagonal close packed cobalt (hcp-Co), that is epitaxially grown on GaAs may be magnetized in a [1 1 0] direction (a direction based on the GaAs crystal) due to the presence of the magnetocrystalline anisotropy. This is why a c axis, which is an easy magnetization axis of the hcp-Co epitaxially grown on the GaAs, faces toward the [1 1 0] direction.

In the operation of the spin transistor 100, a spin-polarized electron is injected into the channel layer 107 from the source 121. The electron injected into the channel layer 107 is passed through the channel layer 107. At this time, the spin of the electron is controlled by a gate voltage (Vg). The spin-polarized electron moves along the channel layer 107, and then is injected into the ferromagnetic drain 121. When an electric field (E: z direction) vertical to a wave vector (k: x direction) of the electron passed through the channel layer 107 is in existence, a magnetic field (y direction) represented by $H_R \propto k \times E$ is formed due to the spin-orbit coupling, which is called a Rashba effect. For example, when an electric current flows in an x direction ($k_x$) and an electric field is applied in a z direction under the effect of a gate voltage, a spin-orbit coupling induced magnetic field ($H_R$) is formed in a y direction. In this case, the spin of the electron passed through the channel layer 107 makes the precession by using the spin-orbit coupling induced magnetic field ($H_R$) as an axis.

Figure 2:
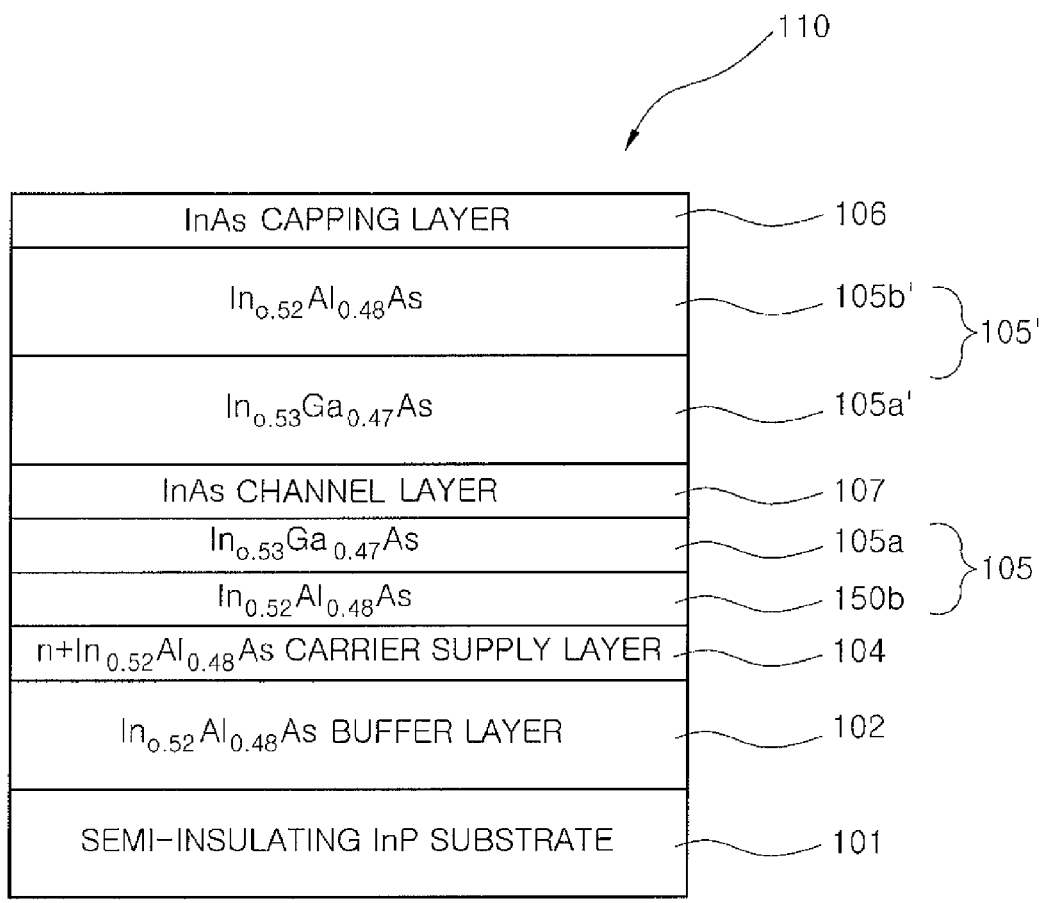
FIG. 2 is a cross-sectional view illustrating a semiconductor substrate of the spin transistor according to one exemplary embodiment of the present invention.

FIG. 2 is a cross-sectional view illustrating a semiconductor substrate 110 of the spin transistor according to one exemplary embodiment of the present invention. Referring to FIG. 2, the semiconductor substrate 110 includes an InAlAs buffer layer 102, an n-doped InAlAs carrier supply layer 104, an undoped InGaAs/InAlAs lower cladding layer 105, an InAs channel layer 107, an undoped InAlAs/InGaAs upper cladding layer 105' and an InAs capping layer 106, all of which are sequentially stacked on the semi-insulating InP substrate 101.

Each of the lower and upper cladding layers 105 and 105' have a double cladding structure of the undoped InGaAs layers 105a and 105a,' and the InAlAs layers 105b and 105b'. That is to say, the lower cladding layer 105 is composed of a first lower cladding layer 105a made of InGaAs; and a second lower cladding layer 105b formed in the bottom of the first lower cladding layer 105a and made of InAlAs. Also, the upper cladding layer 105' is composed of a first upper cladding layer 105a' made of InGaAs; and a second upper cladding layer 105b' formed on the first upper cladding layer 105a' and made of InAlAs. The second lower cladding layer 105b has a higher energy band gap than the first lower cladding layer 105a, and the second upper cladding layer 105b' has a higher energy band gap than the first upper cladding layer 105a'.

The channel layer 107 forms a quantum well due to the presence of an energy barrier in the upper/lower cladding layers 105 and 105'. In particular, the electron is confined to the channel layer 107 by the upper and lower cladding layers 105 and 105, having a double cladding structure, and the channel layer 107 forms a layer of two-dimensional electron gas (2-DEC). The layer of two-dimensional electron gas has a high spin-orbit coupling effect, as well as very high electron mobility. Here, InAs is used as the channel layer 107, but the present invention is not particularly limited thereto. For example, GaAs, InGaAs or InSb may be used as the channel layer having a two-dimensional electron gas structure.

The n-doped InAlAs carrier supply layer 104 is formed in the bottom of the channel layer 107 to supply charges to the channel layer 107, and the InAlAs buffer layer 102 function to reduce a lattice misfit between the InP substrate 101 and the lower cladding layer 105. Also, the InAs capping layer 106 as the uppermost layer of the semiconductor substrate 110 functions to prevent the oxidation and degeneration of the semiconductor substrate 110 that may be caused during its manufacturing process.

Also, the channel layer may be formed of n-doped semiconductor layers. In this case, the channel layer may be formed of a material selected from the group consisting of GaAs, InAs, AlAs, InGaAs, AlGaAs, InSb, and combinations thereof. The source 121 and the drain 122 may be formed of magnetized ferromagnets, for example, formed of a magnetic metal selected from the group consisting of Fe, Co, Ni, CoFe, NiFe, and combinations thereof. On the contrary, at least one of the source 121 and the drain 122 may be formed of a magnetic semiconductor material selected from the group consisting of (Ga, Mn)As, (In, Mn)As, and combinations thereof. As described previously, the magnetocrystalline anisotropy of the epitaxially grown ferromagnetic source and drain 121 and 122 is used so that the easy magnetization axis of the source and drain 121 and 122 can be parallel to the longitudinal direction of the channel layer 107.

Figure 3:
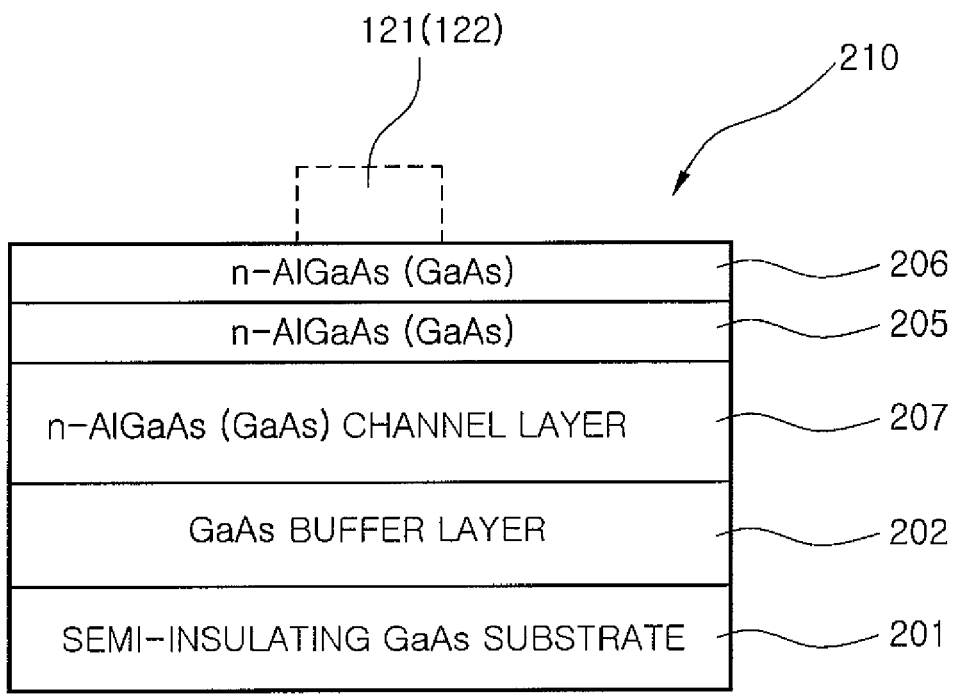
FIG. 3 is a cross-sectional view illustrating a semiconductor substrate of the spin transistor according to another exemplary embodiment of the present invention.

FIG. 3 is a cross-sectional view illustrating a semiconductor substrate of the spin transistor according to another exemplary embodiment of the present invention. Referring to FIG. 3, the semiconductor substrate 210 has a configuration including n-doped multiple layers 207, 205 and 206. In the configuration of n-doped multiple layers 207, 205 and 206, a doping density is decreased from top from bottom, and the lowest layer 207 in the configuration of n-doped multiple layers 207, 205 and 206 becomes a channel layer. Also, the uppermost n-doped layer 206 that is in contact with the ferromagnetic source and drain 121 and 122 forms a schottky barrier with the ferromagnetic source and drain 121 and 122. This schottky barrier contributes to enhancing an effect to inject the spin of electron. The above-mentioned configuration of n-doped multiple layers 207, 205 and 206 may be formed of n-AlGaAs or n-GaAs. In this case, the channel layer 207 may, for example, have a thickness of about 30 nm, and layers 205 and 206 formed on the channel layer 207 may have a thickness of about 10 nm, but the thicknesses of the n-doped multiple layers 207, 205 and 206 may be varied according to their applications or necessity.

Figure 4:
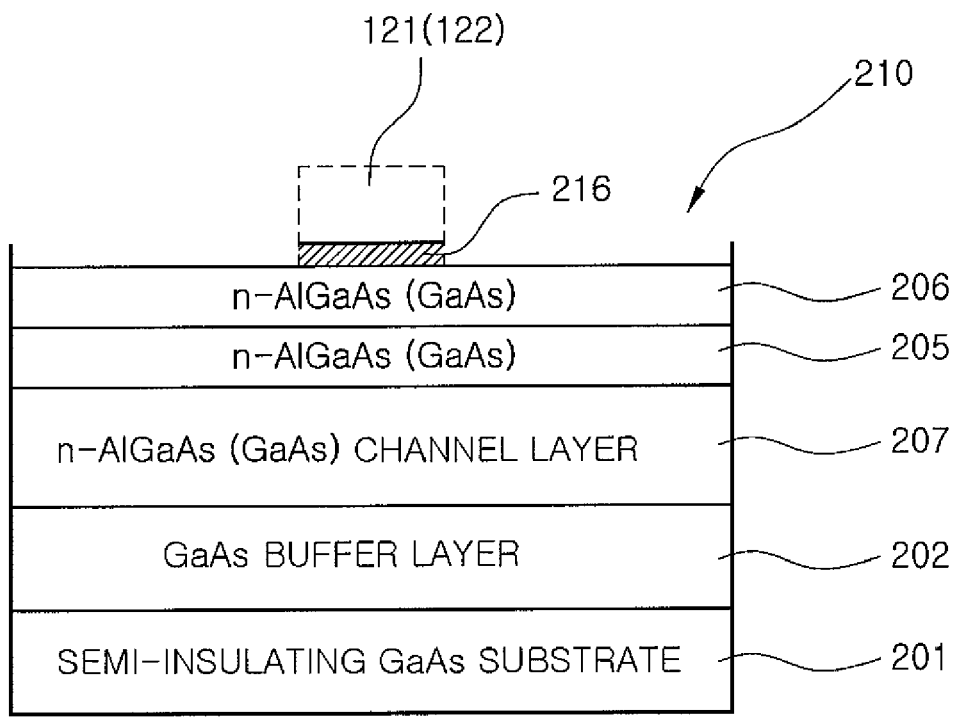
FIG. 4 is a cross-sectional view illustrating that a crystal orientation alignment layer is formed on a semiconductor substrate according to one exemplary embodiment of the present invention.

FIG. 4 is a cross-sectional view illustrating that a crystal orientation alignment layer 216 is formed on a semiconductor substrate according to one exemplary embodiment of the present invention. As shown in FIG. 4, the easy magnetization axis of the ferromagnetic source and drain 121 and 122 may be more easily aligned in a certain direction (especially, a channel direction) by disposing the crystal orientation alignment layer 216 between the semiconductor substrate 210 and the ferromagnetic source and drain 121 and 122.

For example, when ferromagnets for a source and a drain are formed by epitaxially growing hcp-Co on a GaAs semiconductor, a Cr film may be previously formed as a crystal orientation alignment layer 216 on the GaAs semiconductor, and the hcp-Co may be epitaxially grown on the Cr film. In this case, a c axis that is an easy magnetization axis of the hcp-Co may be more easily lined up in a channel direction.

Hereinafter, the method for manufacturing a spin transistor according to one exemplary embodiment of the present invention will be described in detail with reference to FIGS. 5A to 5F.

Figure 5A:
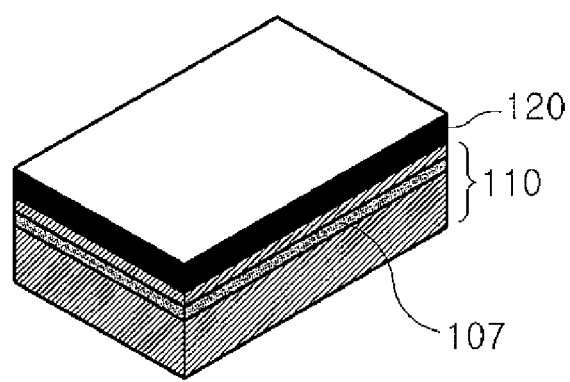
FIGS. 5A to 5F are cross-sectional views illustrating a method for manufacturing a spin transistor according to one exemplary embodiment of the present invention.

First, referring to FIG. 5A, provided is the semiconductor substrate 110 or 210 having a stacked structure as shown in FIG. 2 or 3, and the ferromagnetic layer 120 is epitaxially grown on the semiconductor substrate 110 or 210. In the epitaxial growth of the ferromagnetic layer 120, the ferromagnetic layer 120 is grown in the form of crystal by determining a direction of crystal growth so that the ferromagnetic layer 120 can be magnetized in a certain direction (a channel direction) due to the presence of the magnetocrystalline anisotropy. For example, an hcp-Co ferromagnet may be epitaxially grown on the GaAs semiconductor so that the c axis of the hcp-Co can be directed toward a [1 1 0] direction of the GaAs, as described above. The crystal growth of the ferromagnetic layer 120 may be performed continuously while maintaining the semiconductor substrate under a vacuum condition after the manufacture of the semiconductor substrate. In particular, the crystal growth of the ferromagnetic layer 120 may be carried out through the molecular beam epitaxy (MBE) growth. In this case, the magnetization direction of the ferromagnetic layer 120 is allowed to be directed toward a certain direction (a channel direction) due to the epitaxial growth. Prior to growing the ferromagnetic source and drain 121 and 122 as shown in FIG. 4, the crystal orientation alignment layer 216 may be formed of Cr to adjust the direction of the crystal growth of the ferromagnets.

Figure 5B:
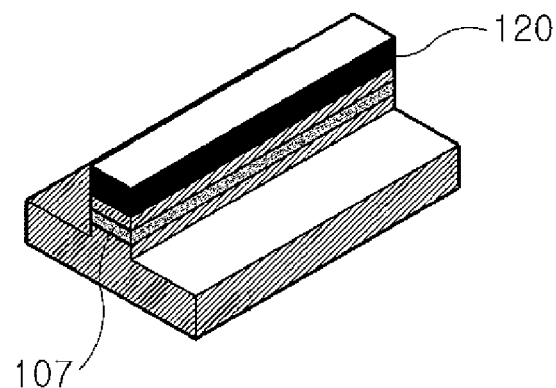

Next, as shown FIG. 5B, the ferromagnetic layer 120 and the semiconductor substrate 110 are patterned to define a longitudinal direction of channels and a channel width, by using a lithography process and an etching process such as ion milling. A ridge structure may be formed in the semiconductor substrate and ferromagnet 110 and 107 by removing the semiconductor substrate and ferromagnet 110 and 107 in both sides of a channel region to a depth that is higher than the channel region, as shown in FIG. 5B. The channel layer 107 having a two-dimensional electron gas structure is defined by the ridge structure. A width of the channel layer 107 defined by the ridge structure may be in a range of about 100 to 800 nm according to the purpose of use of the channel layer 107.

Figure 5C:
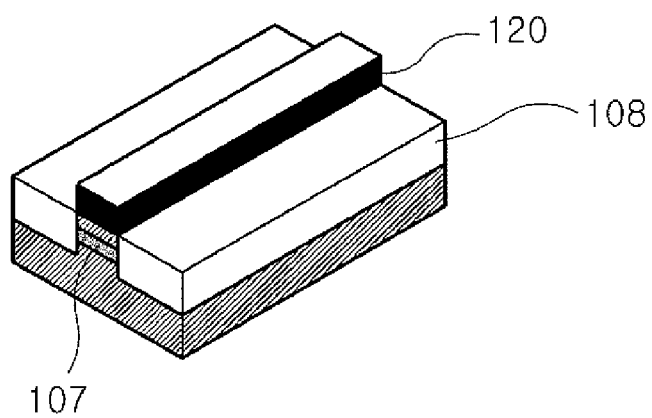

Then, an insulating material or insulator 108 is formed in both side portions of the resulting product of FIG. 5B whose both side portions are removed from the ridge structure for the purpose of the planarization, as shown in FIG. 5C. For example, the insulator 108 may be formed of oxides such as $TaO_x$ or $SiO_2$. The insulator 108 may have a function to insulate one channel from neighboring channels.

Figure 5D:
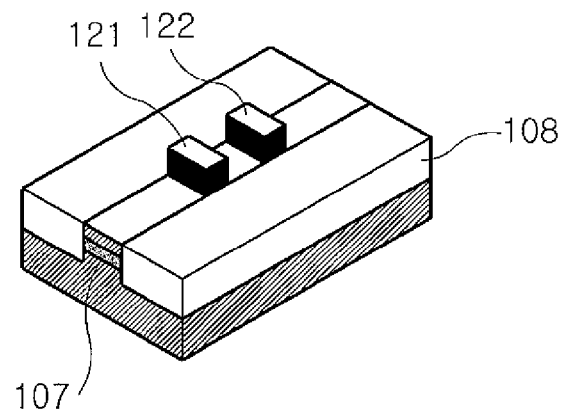

Subsequently, the ferromagnetic layer 120 is patterned to define the source and drain 121 and 122, by using an electron beam lithography process and an etching process such as ion milling, as shown in FIG. 5D. As described previously, the ferromagnetic source and drain 121 and 122 defined by the patterning of the ferromagnetic layer 120 are oriented in the same direction parallel to the longitudinal direction of the channel layer since the ferromagnetic layer 120 is grown in the form of crystal so that its magnetization direction can be parallel to the channel direction.

Figure 5E:
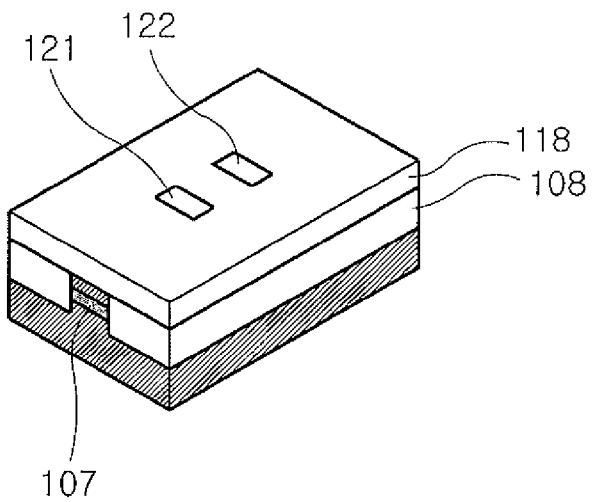
Figure 5F:
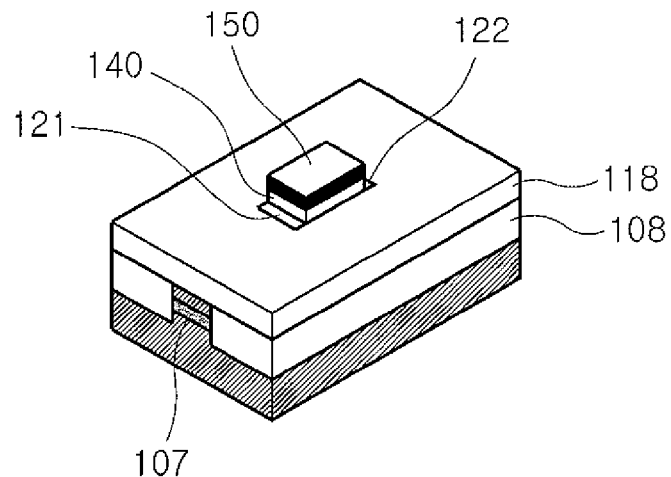

Referring to FIG. 5E, the resulting product of FIG. 5D is then planarized by filling a ferromagnet-free region with the insulator 118 such as oxides. As shown in FIG. 5F, the gate insulator 140 such as $SiO_2$ and the gate 150 such as Al or Au are finally formed on the resulting product of FIG. 5E. As a result, a spin transistor device is obtained. The gate insulator 140 is used to prevent an electric current from being directly leaked from the gate to the semiconductors.

An operation of the above-mentioned spin transistor will be described in detail with reference to FIGS. 6 and 7. An electron flows from the source 121 to the drain 122 via the channel layer 107.

Figure 6:
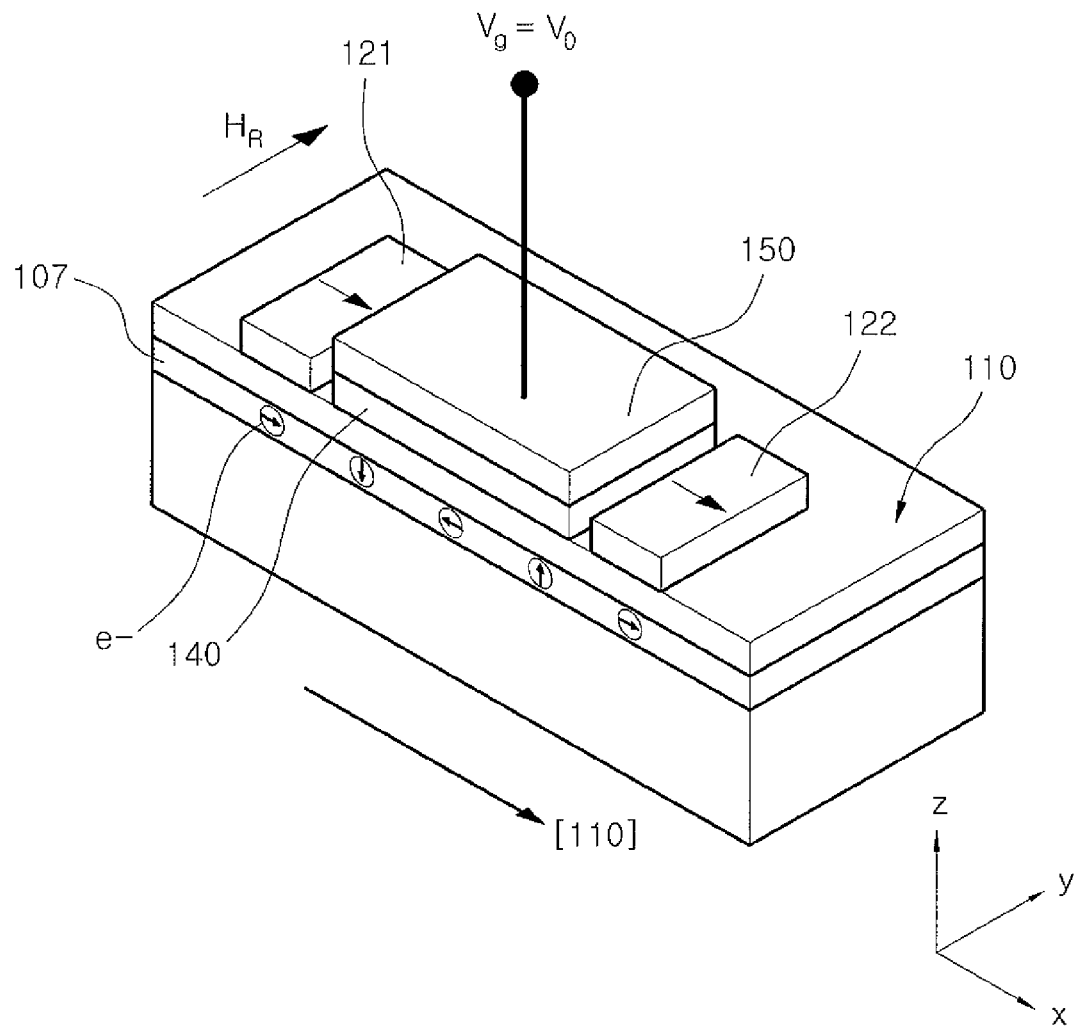
FIGS. 6 and 7 are diagrams illustrating an operation principle of the spin transistor according to one exemplary embodiment of the present invention.

First, when a voltage ($Vg=V_0$) is applied to the gate 150, a spin-orbit coupling induced magnetic field ($H_R$) is formed in a y direction, and therefore the spin electron makes the precession on a x-z plane using the induced magnetic field ($H_R$) as an axis, and then reaches the drain 122, as shown in FIG. 6. When the electron reaches the drain 122 under the control of a precession angle through the gate voltage ($V_0$), a spin direction of the electron is identical (parallel) to the magnetization direction of the drain 122. When the spin of the electron reaching the drain 23 is parallel to the magnetization direction of the drain 23, the spin transistor shows a low resistivity, and becomes a turn-on state.

Figure 7:
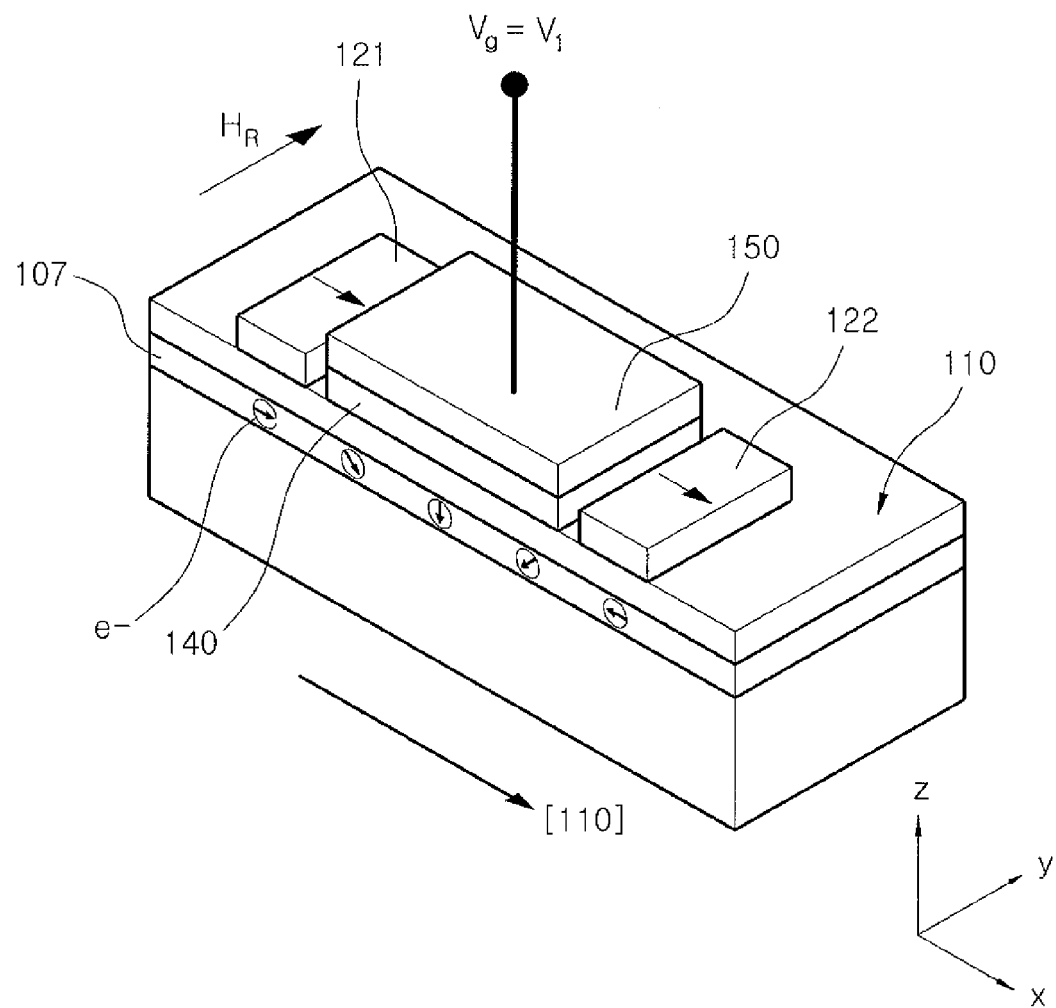

On the contrary, when the spin direction of the electron, which reaches the drain 122 under the control of the precession angle through the gate voltage ($Vg=V_1$), is opposite (anti-parallel) to the magnetization direction of the drain 122, the spin transistor shows a high resistivity, and becomes a turn-off state, as shown in FIG. 7. The resistivity of the spin transistor is controlled by controlling the precession angle of the spin through the gate voltage (Vg) as described above. Therefore, it is possible to control the turn-on/off state of the spin transistor. Here, since the magnetocrystalline anisotropy of the epitaxially grown ferromagnetic source and drain may be used in this exemplary embodiment of the present invention, it is possible to widely design the patterns of the source and drain and also to significantly reduce the size of a unit device.

Figure 8A:
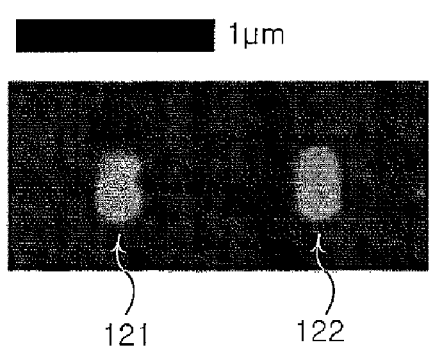
FIG. 8A shows an AFM image and FIG. 8B shows an MFM image.

FIG. 8 shows the effects of the magnetocrystalline anisotropy of hcp-Co ferromagnetic source and drain on the magnetization as an atomic force microscopy (AFM) image and a magnetic force microscopy (MFM) image. As shown in FIG. 8A, patterns 121 and 122 shown in the AFM image are formed of hcp-Co that is used in the source and drain, and the major axis of the patterns is a y axis. Therefore, the hcp-Co patterns 121 and 122 should be magnetized in a y-axis direction in consideration of the shape anisotropy. However, the hcp-Co patterns 121 and 122 are epitaxially grown so that the c axis in the hcp structure can be directed toward the x axis.

Figure 8B:
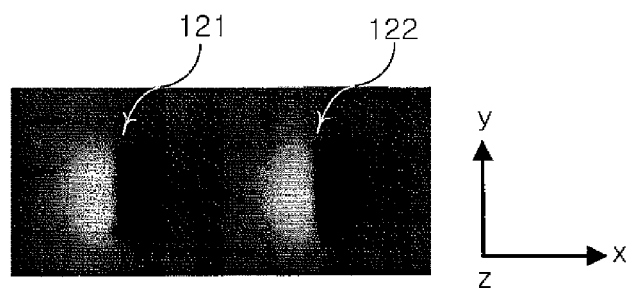

In the MFM image of FIG. 8B, since a bright region and a dark region in each of the patterns 121 and 122 represent the N pole and the S pole, respectively (for example, a bright region in the pattern 121 represents the N pole and a dark region in the pattern 121 represents the S pole), the magnetization direction of the hcp-Co patterns is parallel to the x axis. As a result, it is revealed that problems of the shape anisotropy are overcome in the use of the magnetocrystalline anisotropy, and the magnetization direction of the ferromagnets is determined according to the direction of crystal growth. Therefore, the shapes of the source and drain may be easily controlled by controlling the direction of crystal growth of the epitaxially grown ferromagnets.

Figure 9:
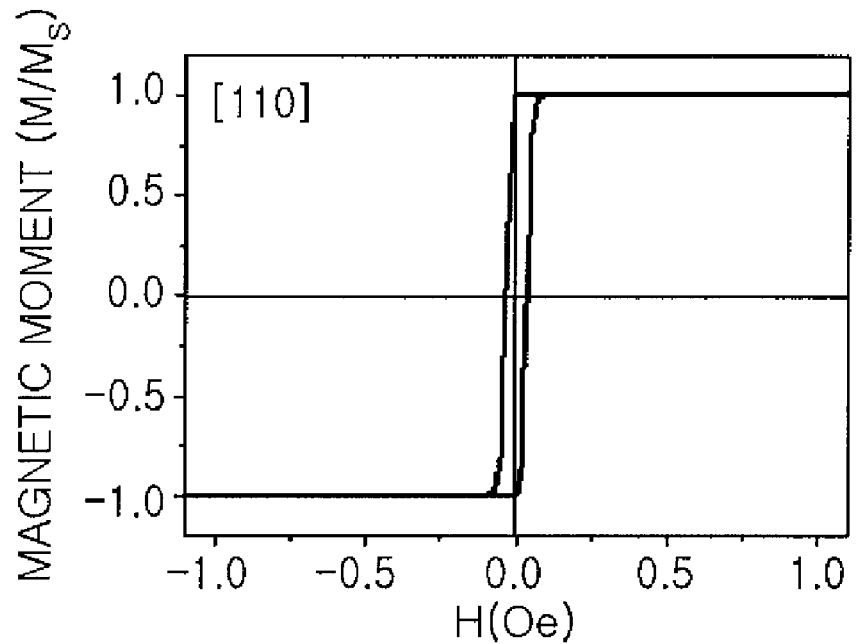
FIGS. 9 and 10 are graphs illustrating a magnetic hysteresis curve relative to the crystal orientation of an hcp-Co ferromagnetic thin film that is formed through the epitaxial growth according to one exemplary embodiment of the present invention.
Figure 10:
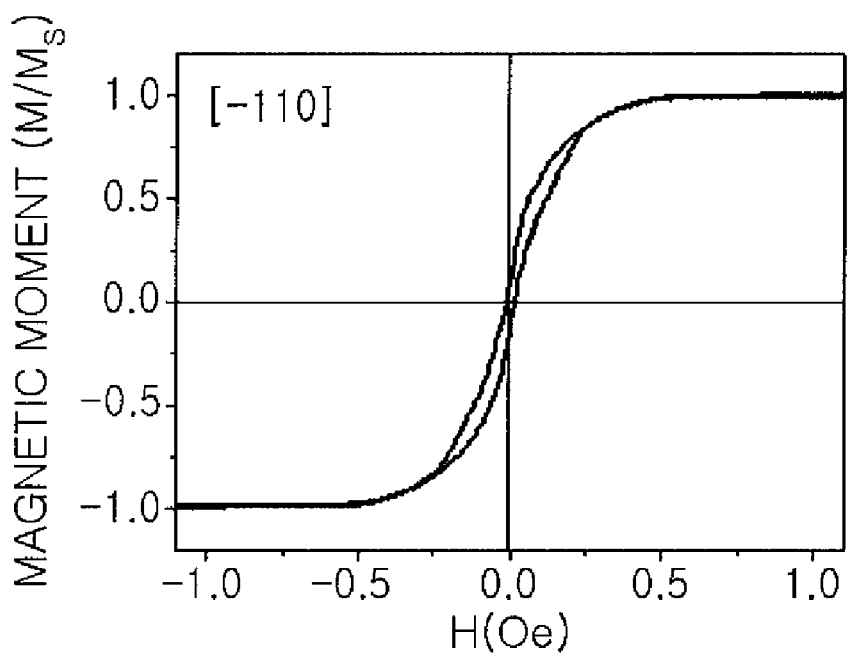

FIGS. 9 and 10 show magnetic hysteresis curves according to the crystal orientation of an epitaxially grown hcp-Co thin film. These curves are plotted from the magnetic moments obtained when a magnetic field is applied to the hcp-Co thin film using an alternating gradient magnetometer (AGM). Here, GaAs is used as a seed substrate formed in the bottom of the hcp-Co thin film. In FIGS. 9 and 10, the hysteresis curves are obtained when the magnetic field is applied in directions of [1 1 0] and [−1 1 0] on the basis of the GaAs. For comparison, the two hysteresis curves are represented by the same scale (M/Ms, i.e., a value obtained by dividing measurement values of magnetic moment by a saturated magnetic moment). As shown in FIGS. 9 and 10, it is revealed that the GaAs [1 1 0] direction that is the c axis of the most hcp-Co is the easy magnetization axis of the hcp-Co since the hcp-Co thin film has a very higher rectangular remnant magnetization value in the GaAs [1 1 0] direction.

The spin transistor according to the present invention may be useful to easily reduce the lengths of the source and drain using the epitaxially grown ferromagnetic source and drain that are magnetized in a channel direction due to the presence of the magnetocrystalline anisotropy, and thus to achieve the miniaturization and large scale integration of the devices. Also, the spin transistor according to the present invention may be useful to enhance the effect to inject the spin-polarized electron by forming a high-quality semiconductor-ferromagnet interface, and to improve the efficiency of the transistors since it is possible to shorten a distance between the centers of the source and the drain.

While the present invention has been shown and described in connection with the exemplary embodiments, it will be apparent to those skilled in the art that modifications and variations can be made without departing from the spirit and scope of the invention as defined by the appended claims.

What is claimed is:

1. A spin transistor, comprising:
a semiconductor substrate having a channel layer formed therein;
a ferromagnetic source and a drain epitaxially grown on the semiconductor substrate and magnetized in a longitudinal direction of the channel layer due to magnetocrystalline anisotropy, the source and drain being disposed spaced apart from each other in the channel direction and magnetized in the same direction to each other; and
a gate disposed between the source and the drain insulated with the semiconductor substrate and formed on the semiconductor substrate to control the spin direction of electrons passing through the channel layer;
wherein the source and drain have an easy magnetization axis parallel to a longitudinal direction of the channel layer due to the magnetocrystalline anisotropy; and
wherein an upper portion of the semiconductor substrate is formed of GaAs, the source and drain are formed of hexagonal close packed cobalt (hcp-Co), and a c axis of the hcp-Co is directed toward a [1 1 0] direction of the GaAs.

2. The spin transistor of claim 1, wherein the channel layer is a two-dimensional electron-gas layer.

3. The spin transistor of claim 2, wherein the two-dimensional electron-gas layer is formed of a material selected from the group consisting of GaAs, InAs, InGaAs, InSb and combinations thereof.

4. The spin transistor of claim 2, wherein the semiconductor substrate comprises a lower cladding layer and an upper cladding layer sandwiching the channel layer, and wherein the lower cladding layer comprises a first lower cladding layer and a second lower cladding layer formed under the first lower cladding layer, the second lower cladding layer having a higher band gap than the first lower cladding layer, and the upper cladding layer comprises a first upper cladding layer and a second upper cladding layer formed on the first upper cladding layer, the second upper cladding layer having a higher band gap than the first upper cladding layer.

5. The spin transistor of claim 1, wherein the semiconductor substrate comprises a ridge structure in which both side portions of the semiconductor substrate are removed along a longitudinal direction of the channel layer, and a width of channels is defined by the ridge structure, wherein an insulating material for planarization is formed in both sides of the ridge structure.

6. A spin transistor, comprising:
a semiconductor substrate having a channel layer formed therein;
a ferromagnetic source and a drain epitaxially grown on the semiconductor substrate and magnetized in a longitudinal direction of the channel layer due to magnetocrystalline anisotropy, the source and drain being disposed spaced apart from each other in the channel direction and magnetized in the same direction to each other; and
a gate disposed between the source and the drain insulated with the semiconductor substrate and formed on the semiconductor substrate to control the spin direction of electrons passing through the channel layer,
wherein a crystal orientation alignment layer adjusting the crystal orientation of the source and drain to allow the easy magnetization axis of the source and drain to be directed toward the longitudinal direction of the channel layer is disposed between the source and the semiconductor substrate and between the drain and the semiconductor substrate; and
wherein an upper portion of the semiconductor substrate is formed of GaAs, the source and drain are formed of hcp-Co, and a crystal orientation alignment layer made of chromium (Cr) is disposed between the source and the GaAs and between the drain and the GaAs.

7. A spin transistor, comprising:
a semiconductor substrate having a channel layer formed therein;
a ferromagnetic source and a drain epitaxially grown on the semiconductor substrate and magnetized in a longitudinal direction of the channel layer due to magnetocrystalline anisotropy, the source and drain being disposed spaced apart from each other in the channel direction and magnetized in the same direction to each other; and
a gate disposed between the source and the drain insulated with the semiconductor substrate and formed on the semiconductor substrate to control the spin direction of electrons passing through the channel layer;
wherein a portion of the semiconductor substrate spanning from a contact surface of the source and drain to the channel layer comprises n-doped multiple layers, the n-doped multiple layers having a doping density that decreases from top to bottom, the lowest layer of the n-doped multiple layers being used as the channel layer, and the uppermost layer of the n-doped multiple layers forming a schottky barrier with the source and drain.

8. The spin transistor of claim 7, wherein the n-doped multiple layers comprise first to third n-AlGaAs layers sequentially stacked from the bottom, wherein the first n-AlGaAs layer has a lower doping density than the second n-AlGaAs layer and the second n-AlGaAs layer has a lower doping density than the third n-AlGaAs layer.

9. The spin transistor of claim 7, wherein the n-doped multiple layers comprise first to third n-GaAs layers sequentially stacked from the bottom, wherein the first n-GaAs layer has a lower doping density than the second n-GaAs layer and the second n-GaAs layer has a doping density than the third n-GaAs layer.

10. A method for manufacturing a spin transistor, the method comprising:
   providing a semiconductor substrate having a channel layer formed therein;
   epitaxially growing a ferromagnetic layer on the semiconductor substrate;
   defining a longitudinal direction and width of the channel layer by patterning the ferromagnetic layer and the semiconductor substrate;
   defining a source and a drain by patterning the ferromagnetic layer, the source and the drain being disposed spaced apart from each other along the longitudinal direction of the channel layer; and
   forming a gate insulator and a gate on the resulting product, the gate insulator and the gate being disposed between the source and the drain;
   wherein, in the step of epitaxially growing a ferromagnetic layer, the ferromagnetic layer is grown in the form of crystal so that the ferromagnetic layer is magnetized in a longitudinal direction of the channel layer due to magnetocrystalline anisotropy;
   wherein, in the step of epitaxially growing a ferromagnetic layer, the ferromagnetic layer is grown so that the easy magnetization axis of the ferromagnetic layer is disposed parallel to the longitudinal direction of the channel layer due to the magnetocrystalline anisotropy; and
   wherein an upper portion of the semiconductor substrate is formed of GaAs, and wherein the step of epitaxially growing a ferromagnetic layer includes: epitaxially growing an hcp-Co layer so that a c axis of the hcp-Co is directed toward a [1 1 0] direction of the GaAs.

11. The method of claim 10, wherein the step of epitaxially growing a ferromagnetic layer is performed through molecular beam epitaxy (MBE) growth.

12. The method of claim 10, wherein the step of defining a longitudinal direction and a width of the channel layer includes: forming a ridge structure to define a channel width by removing a semiconductor and a ferromagnet from both sides of a channel region using an etching process, and
   the method further comprises forming an insulating material for planarization in both side portions from which the semiconductor and the ferromagnet has been removed to form the ridge structure.

13. A method for manufacturing a spin transistor, the method comprising:
   providing a semiconductor substrate having a channel layer formed therein;
   epitaxially growing a ferromagnetic layer on the semiconductor substrate;
   defining a longitudinal direction and width of the channel layer by patterning the ferromagnetic layer and the semiconductor substrate;
   defining a source and a drain by patterning the ferromagnetic layer, the source and the drain being disposed spaced apart from each other along the longitudinal direction of the channel layer; and
   forming a gate insulator and a gate on the resulting product, the gate insulator and the gate being disposed between the source and the drain;
   forming a crystal orientation alignment layer on the semiconductor substrate, between providing a semiconductor substrate and epitaxially growing a ferromagnetic layer, the crystal orientation alignment layer serving to allow an easy magnetization axis of the ferromagnetic layer to be directed toward the longitudinal direction of the channel layer;
   wherein, in epitaxially growing a ferromagnetic layer, the ferromagnetic layer is grown in the form of crystal so that the ferromagnetic layer is magnetized in a longitudinal direction of the channel layer due to magnetocrystalline anisotropy
   wherein an upper portion of the semiconductor substrate is formed of GaAs, a Cr film is formed as the crystal orientation alignment layer on the GaAs, and hcp-Co is formed as the ferromagnetic layer.

* * * * *